US 8,203,466 B2

(12) United States Patent
Rudd et al.

(10) Patent No.: US 8,203,466 B2
(45) Date of Patent: Jun. 19, 2012

(54) PULSED ANTENNA CAPACITIVE TOUCH SWITCH

(75) Inventors: Jeffrey P. Rudd, Foxboro, MA (US); Levi G. Fox, Charlestown, MA (US); David Malcom Howie, Foxboro, MA (US); Thomas A. Mignone, North Falmouth, MA (US); James Pellegrini, Milbury, MA (US)

(73) Assignee: Illinois Tool Works Inc., Glenview, IL (US)

( * ) Notice: Subject to any disclaimer, the term of this patent is extended or adjusted under 35 U.S.C. 154(b) by 562 days.

(21) Appl. No.: 12/527,587

(22) PCT Filed: Apr. 18, 2008

(86) PCT No.: PCT/US2008/060812
§ 371 (c)(1),
(2), (4) Date: Aug. 18, 2009

(87) PCT Pub. No.: WO2008/131213
PCT Pub. Date: Oct. 30, 2008

(65) Prior Publication Data
US 2010/0109917 A1 May 6, 2010

Related U.S. Application Data

(60) Provisional application No. 60/913,112, filed on Apr. 20, 2007.

(51) Int. Cl.
*H03M 11/00* (2006.01)
(52) U.S. Cl. .............................. 341/20; 341/33; 200/600
(58) Field of Classification Search .................. 341/20, 341/33; 200/600
See application file for complete search history.

(56) References Cited

U.S. PATENT DOCUMENTS

| 4,103,252 | A | 7/1978 | Bobick |
| 4,363,029 | A | 12/1982 | Piliavin et al. |
| 5,053,757 | A | 10/1991 | Meadows |
| 6,246,862 | B1 | 6/2001 | Grivas et al. |
| 6,621,029 | B2 * | 9/2003 | Galmiche et al. ............. 200/600 |
| 6,723,937 | B2 * | 4/2004 | Englemann et al. ......... 200/600 |
| 7,098,414 | B2 | 8/2006 | Caldwell |
| 7,154,481 | B2 * | 12/2006 | Cross et al. ................... 345/173 |
| 2006/0187216 | A1 | 8/2006 | Trent et al. |
| 2007/0030221 | A1 | 2/2007 | Pak et al. |

FOREIGN PATENT DOCUMENTS

| GB | 2 137 783 | 10/1984 |
| WO | WO 96/13098 | 5/1996 |
| WO | WO 00/42628 A1 | 7/2000 |

OTHER PUBLICATIONS

PCT International Search Report, Aug. 11, 2009, PCT International Searching Authority, United States Patent and Trademark Office, Alexandria, Virginia, USA.
Mesplede, Delphine, Supplementary European Search Report, European Patent Office, May 25, 2010, Munich, Germany.

* cited by examiner

*Primary Examiner* — Khai M Nguyen
(74) *Attorney, Agent, or Firm* — Mark W. Croll; Paul F. Donovan

(57) ABSTRACT

A capacitive touch switch suitable for use in areas with high environmental and electrical contamination employs a complex excitation signal that is demodulated to better distinguish it from environmental effects. Improved discrimination allows these sensed signals to be offset against a signal developed by a reference electrode to allow the system to operate robustly with contamination on the electrodes that would otherwise trigger or obscure pulses.

14 Claims, 4 Drawing Sheets

PULSED ANTENNA CAPACITIVE TOUCH SWITCH

CROSS-REFERENCE TO RELATED APPLICATIONS

This application claims the benefit of US provisional application 60/913,112 filed Apr. 20, 2007, and PCT Application No. PCT/US2008/060812, filed Apr. 18, 2008, the disclosures of which are incorporated herein by reference.

STATEMENT REGARDING FEDERALLY SPONSORED RESEARCH OR DEVELOPMENT

BACKGROUND OF THE INVENTION

The present invention relates to capacitive touch switches and in particular to a capacitive touch switch having improved immunity against false triggering.

Touch switches, which sense a change in the electrical environment around the touch point, for example, when a finger is moved over a stationary electrode near the touch point, provide a number of advantages over conventional mechanical switches with movable contacts. Because touch switches have no moving parts, they are particularly well-suited to applications where there is mechanical shock and long life is required. Further, because touch switches do not require a movable operator, they may be easily sealed from environmental contaminants such as dirt or water.

One type of capacitive touch switch senses a change in capacitive coupling between an antenna electrode and a sense electrode. This change may be, for example, a decrease in coupling between the antenna and sense electrode caused by the diversion of electrical energy into a capacitive coupling to the user's hand. By sensing capacitive effects only, it is possible to cover the sensing electrodes with an insulating protective layer.

For capacitive touch switches of reasonable size, the measured capacitive coupling is relatively small and thus sensitive circuitry must be used to detect the "touch". Such sensitive circuitry is prone to false triggering caused by electromagnetic interference from other electrical devices. In addition, the small changes in capacitive coupling caused by a finger touch, can often be overwhelmed by larger environmental capacitive changes, for example, those caused by environmental contaminants such as dirt, water, or ice, preventing detection of the finger touch.

While the mechanical advantages of capacitive touch switches recommend them for automotive use where they would resist mechanical shock and environmental contamination, the problems of false triggering and signal saturation have prevented their widespread adoption.

BRIEF SUMMARY OF THE INVENTION

The present invention provides a touch switch providing separate sense and reference electrodes that may be used to separately measure capacitive coupling with respect to a common antenna electrode. The reference electrode is displaced from a touch point of the switch and thus provides a measure of environmental contamination that may be used to adjust a switching threshold of the sense electrode (located near the touch point) making the switch far more resistant to contamination of the touch surface with dirt, water, ice and the like.

Specifically then, the present invention provides a capacitive touch switch having an electrically insulating touch surface providing a touch area for activation of the touch switch. Behind the touch surface are positioned a sense electrode at the touch area, an antenna electrode proximate to the sense electrode, and a reference electrode proximate to the antenna electrode but removed from the touch area relative to the sense electrode. A detector circuit monitors the signal flowing between the antenna electrode and each of the sense electrode and reference electrode to provide a switch output based on a comparison of the capacitive coupling between the antenna electrode and the sense electrode compared to a threshold that is a function of the capacitive coupling between the antenna electrode and the reference electrode.

It is thus an object of one embodiment of the invention to compensate for changes in the environment of the switch allowing more robust discrimination under a range of circumstances.

The antenna electrode may form a ring around the sense electrode and the reference electrode is outside of the ring. In addition the reference electrode may form a ring around the antenna electrode.

It is thus an object of one embodiment of the invention to provide comparable capacitive coupling between the antenna electrode and each of the sense electrode and reference electrode while displacing the reference electrode from the touch point.

Alternatively, the reference electrode may be broken in an access direction likely to be proximate to a user's hand during use of the touch switch.

It is thus an object of one embodiment of the invention to permit the use of the capacitive touch switch in applications where a user's fingers must reach around a handle or the like to access the touch point.

The signal from the reference electrode may be averaged over a time window greater than the time window of an average applied to the signal for the sense electrode.

It is thus an object of one embodiment of the invention to further tailor the reference electrode to sensing slowly changing environmental conditions.

The capacitive switch may further include a peak detector system detecting a peak and trough of a signal received at the reference and sense electrodes to provide a difference between their heights.

Thus it is an object of one embodiment of the invention to effectively increase the sensitivity of the switch by evaluating the difference between highest and lowest received pulse signals rather than simply height of the received signal.

The detector circuit may include a modulator producing an irregular excitation signal communicated to the antenna electrode, wherein the irregular excitation signal consists of a series of pulses varying in at least one of magnitude and spacing, and a demodulator communicating with the sense electrode to receive the irregular excitation signal as capacitively coupled from the antenna electrode, the demodulator discriminating between the irregular excitation signal and other electrical signals to trigger the switch output.

Thus it is one object of one embodiment of the invention to provide improved discrimination against regular electronic interference.

The demodulator may operate synchronously with the modulator.

Thus it is an object of one embodiment of the invention to provide a simple means of discriminating against phase and frequency shifted interference.

The irregular excitation signals may consist of a series of pulses varying in both magnitude and spacing.

Thus it is an object of one embodiment of the invention to provide multiple dimensions of signal irregularity to discriminate the switch signal from environmental electrical signals.

The demodulators may correlate a received signal with the irregular excitation signal to provide a de-correlation.

It is thus an object of one embodiment of the invention to provide a multidimensional comparison of the received signal to the modulated signal.

The switch may include a timer element requiring detection of a demodulated signal by the demodulator for a predetermined time period before producing an output switch signal.

It is thus an object of one embodiment of the invention to further guard against false activation caused by short-term interference.

The pulses may have a range of dominant frequencies between substantially 100 Hz and 5 kHz.

It is thus an object of one embodiment of the invention to employ a frequency range allowing practical circuit design while avoiding interference in this frequency range.

The touch switch may further include a monitoring circuit monitoring asymmetry of the signal from the second electrode with respect to ground.

It is thus an object of one embodiment of the invention to provide a method of detecting damage or contamination to the switch.

The modulators may be implemented at least in part by a single microprocessor.

It is thus an object of one embodiment of the invention to provide a practical and cost-effective method of complex signal processing with a touch switch.

These particular features and advantages may apply to only some embodiments falling within the claims and thus do not define the scope of the invention.

DETAILED DESCRIPTION OF THE PREFERRED EMBODIMENT

Figure 1:
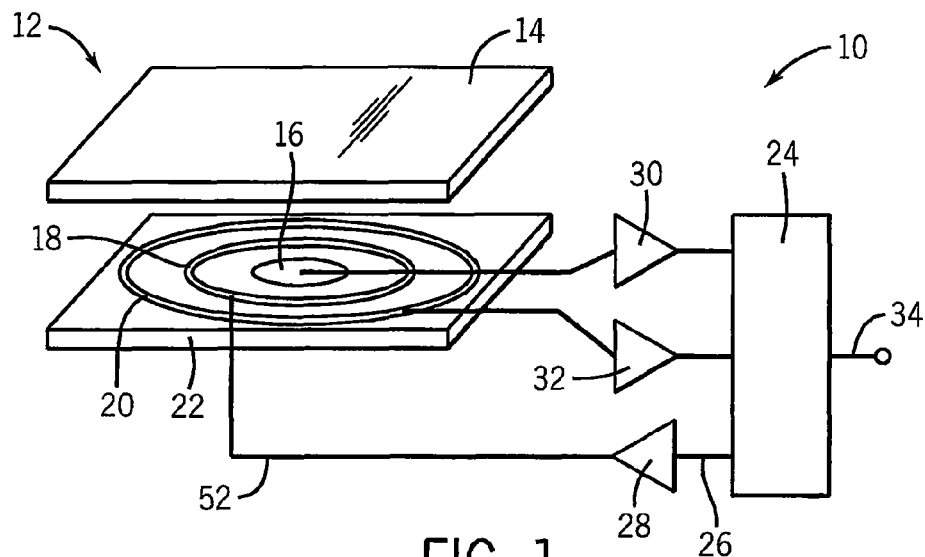
FIG. 1 is a simplified, exploded view of a touch switch of the present invention showing a sense electrode encircled by an antenna electrode in turn surrounded by a reference electrode, all communicating with a microprocessor.

Referring now to FIG. 1, a touch switch 10 of the present invention provides electrode assembly 12 consisting of a touch surface 14 providing an insulating protective layer covering a set of metal electrodes including a sense electrode 16, an antenna electrode 18, and a reference electrode 20 supported on a substrate 22 that may be rigid or flexible.

In the preferred embodiment, the sense electrode 16 may be spaced from and surrounded by an annular antenna electrode 18 which in turn may be spaced from and surrounded by an annular reference electrode 20.

A microprocessor 24 provides a digital to analog output 26 received by a power amplifier 28 to provide a set of voltage pulses to the antenna electrode 18 according to a stored program as will be described. The power amplifier 28 may, for example, be a simple transistor circuit of the type well known in the art.

Signals from the sense electrode 16 and reference electrode 20 are received by buffer amplifiers 30 and 32 respectively and provided to analog to digital inputs of the microprocessor 24 which may monitor voltages at these electrodes. The microprocessor 24 may further provide a digital output 34 providing a switch output for use in controlling other electrical devices in a manner of standard mechanical switches.

Figure 2:
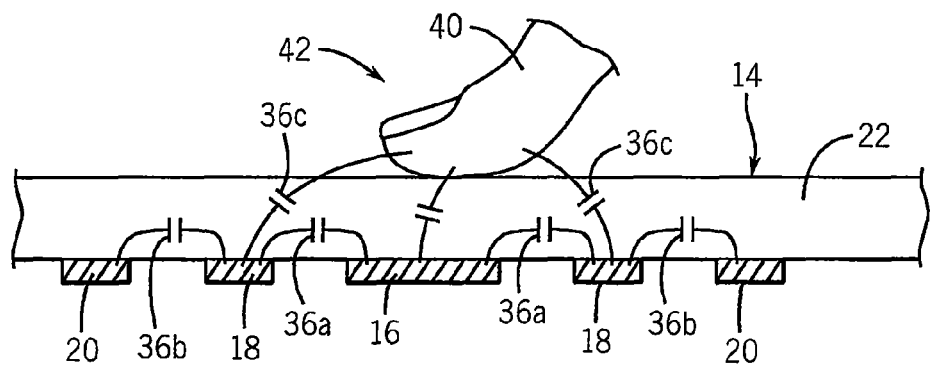
FIG. 2 is an elevational cross-section through a center of the electrode assembly of FIG. 1 showing a finger touch at a touch point and showing capacitive couplings affecting triggering of the present invention.

Referring now to FIG. 2, as will be described in more detail below, the signal applied by power amplifier 28 to the antenna electrode 18 may be capacitively coupled to the sense electrode 16 as shown by coupling capacitances 36a resulting generally from the proximity of the conductors of sense electrode 16 and pulse antenna electrode 18. Similar coupling capacitances 36b communicate between the antenna electrode 18 and the reference electrode 20. As a result of these capacitances 36a and 36b, a certain amount of electrical power from the antenna electrode 18 is coupled to the sense electrode 16 and the reference electrode 20.

As will be described in greater detail below, the touch switch 10 couples a pulsed signal from an antenna electrode 18 as a transmitter to the sense electrode 16 as a receiver. The electrodes 16 and 18, being in proximity with each other, form a capacitor having a substantially constant capacitance so that a capacitive coupled signal is then introduced from the antenna electrode to the sense electrode. A "switch" signal will be derived from the signal that is at the sense electrode according to subsequent processing circuitry. Generally the switch signal is the composite of four factors; (1) the signal induced by the antenna electrode 18, (2) the effects of unwanted stray or parasitic capacitance, (3) the effects of the processing circuitry, and (4) the capacitance of an object as it approaches the sense electrode (such as a finger). The effect of the fourth factor (i.e. a user's finger) causes a coupling to ground through the user's body at the sense electrode. This "grounding" effect on the sense electrode causes a measurable loss in signal energy and can be used to determine a switch state.

Referring still to FIG. 2, a touch from a finger 40 or the like at a touch area 42 centered on the sense electrode 16 will produce coupling capacitance 36c between the finger 40 and either or both of the antenna electrode 18 and the sense electrode 16, essentially drawing power away from the sense electrode 16 decreasing the signal strength at the sense electrode 16. This effect will disproportionately decrease the signal at the sense electrode 16 compared to the reference electrode 20, the latter of which is further removed from the touch area 42 than the sense electrode 16. As will be described in more detail below, this difference in signals caused by the touch of finger 40 will be detected and used to trigger the touch switch 10.

Figure 3:
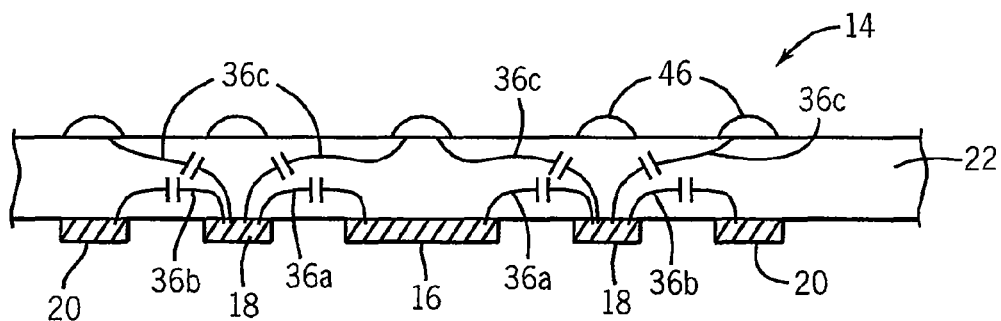
FIG. 3 is a figure similar to that of FIG. 2 showing capacitive couplings associated with environmental dirt, water, or ice.

Referring now to FIG. 3, the presence of contaminants on the touch surface 14, for example raindrops 46, will also cause capacitive coupling 36c, but this capacitive coupling will equally affect the signal strength at sense electrode 16 and reference electrode 20 providing a method of distinguishing between a touch at touch area 42 and such environmental contamination.

Figure 4:
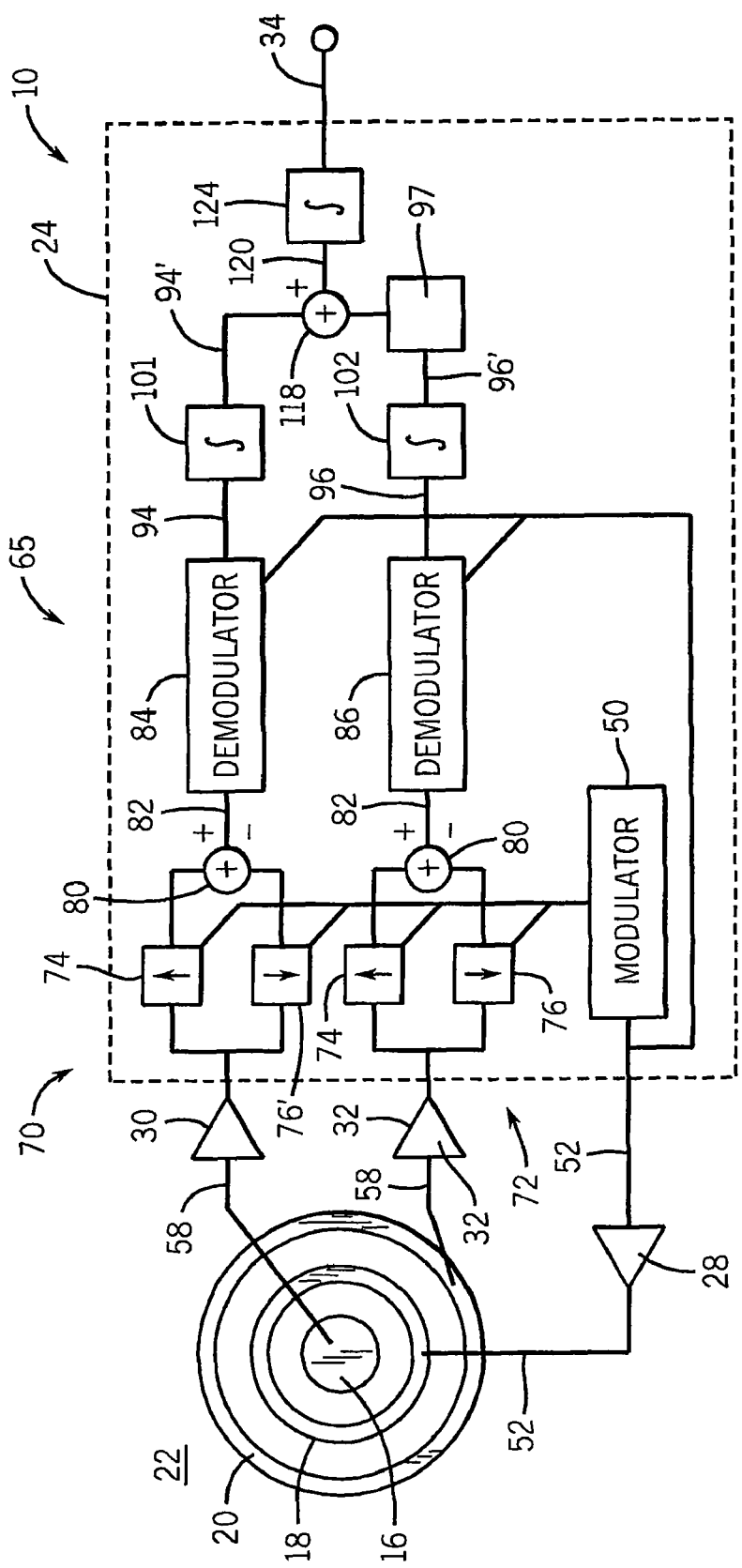
FIG. 4 is a functional block diagram of the operation of the present invention as implemented in the microprocessor including peak detection, modulation and demodulation, averaging, and threshold.
Figure 5:
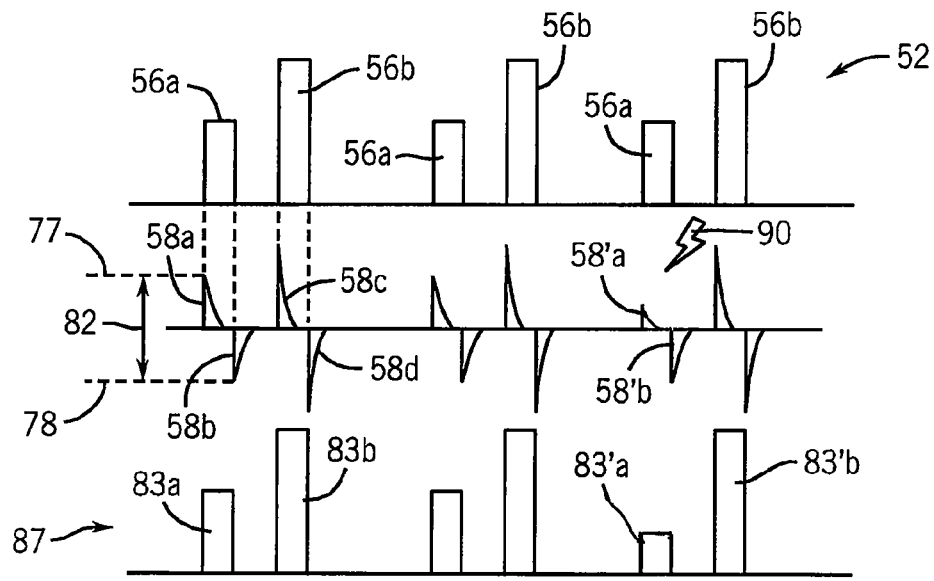
FIG. 5 is a set of three vertically aligned graphs showing a pulse sequence delivered to the antenna electrode of FIG. 1, the signal received by the sense electrode, and a reconstructed signal used by the demodulator of FIG. 4.

Referring now to FIG. 4, in processing the signals from the sense electrode 16 and reference electrode 20, the microprocessor 24 may implement a detection circuit 65 through an internal software program, a modulator 50 providing a pulse sequence 52 to power amplifier 28 and thus to antenna electrode 18. Referring also to FIG. 5, this pulse sequence 52 preferably produces an irregular excitation signal meaning that it consists of a series of pulses 56a and 56b (unipolar in this example) where pulses 56a have a lesser magnitude than pulses 56b and thus are irregular in amplitude, and where pulses 56a are spaced closer to the succeeding pulse 56b than to the preceding pulse 56b and thus are irregular in time. Generally the repetition rate of each pulse 56a and pulse 56b will be approximately 5 kHz. The irregular excitation signal is intended to be readily distinguishable from common environmental electrical noise, for example, 60-cycle line power interference or the ignition signal of an automotive engine.

Referring again to FIG. 4, the pulse sequence 52 will be received at the sense electrode 16 and reference electrode 20 as a series of spikes 58a and 58b (shown in FIG. 5) representing generally the derivative of pulse 56a and spikes 58c and 58d representing generally the derivative of pulse 56b. As such, spike 58a is positive going and aligned approximately with the leading edge of pulse 56a and spike 58b is negative going and aligned approximately with the trailing edge of pulse 56a. During normal operation of the touch switch 10, the magnitude of spikes 58a and spikes 58b are generally proportional to the height of pulse 56a.

Similarly, spike 58c corresponds to the leading edge of pulse 56b and spike 58d corresponds to that falling edge of pulse 56b. The magnitude of spikes 58c and 58d are larger comporting with the greater amplitude of pulse 56b compared to pulse 56a.

These spikes 58 are received by the buffer amplifiers 30 and 32 and converted by the analog-to-digital converter of the microprocessor 24 to digital signals for digital processing. These digital signals are then received at excursion detectors 70 and 72 respectively, each implemented in software as will be the case with the following described elements within the microprocessor 24.

The excursion detectors 70 and 72 consist of a peak grabber 74 and a trough grabber 76 respectively controlled by the modulator 50 to sample and hold a peak magnitude 77 of spikes 58a (or spikes 58c) and a trough magnitude 78 of spikes 58b (or spike 58d). The values of the peak magnitude 77 for each spike (e.g. 58a) has subtracted from it the trough magnitude 78 of the corresponding spike (e.g. 58b), as indicated by summing blocks 80 to essentially double the detected amplitude of received signal from the sense electrode 16 and reference electrode 20. The output 82 of the summing blocks 80 provides a measure of the relative amplitude of the underlying pulses 56 received at each of the sense electrode 16 and reference electrode 20.

The synchronous detection of the peak magnitude 77 and trough magnitude 78 triggered by the modulator 50 provides additional resistance to the effects of electrical interference that occur outside of the time periods of pulses 56a and 56b.

Referring still to FIG. 4, the values of the output 82 for a cycle of pulses 56 (shown in FIG. 5), indicated by a signal from the modulator 50, are collected by demodulators 84 and 86, the former associated with the sense electrode 16 and the latter with the reference electrode 20. These outputs 82 are used to create a demodulated signal 87 essentially mirroring pulse sequence 52 attenuated by the degree of capacitive coupling and possibly corrupted by noise. Note that absent noise or change in attenuation, the demodulated signal 87 provides pulses 83a and 83b having different amplitudes and different spacing corresponding generally to pulses 56a and 56b of pulse sequence 52. Electrical interference, indicated schematically as 90, may cause a change in the height of spikes 58a' and 58b' causing a corresponding change in the height of pulses 83a' and 83b' corresponding to these spikes 58a' and 58b'. More generally, electrical interference 90 may add false pulses 83 or completely eliminate pulses 83.

The demodulators 84 and 86 may, for example, demodulate the signal 87 by cross correlation between the signal 87 and the pulse sequence 52 thereby being sensitive both to pulses 83 that are too high or too low or shifted in phase. The demodulators 84 and 86 provide match signals 94 and 96 respectively whose output values indicate the degree of correlation.

These match signals 94, 96 are received by window averagers 101 and 102 respectively which average these demodulated values for different time windows, with the window averager 102 having a longer averaging window. This difference between time windows has the effect of smoothing the changes in the output of modulator 86 to better track relatively slowly changing environmental conditions while allowing rapid response from the demodulator 84 attracting relatively quick detection of finger touches and the like.

Figure 6:
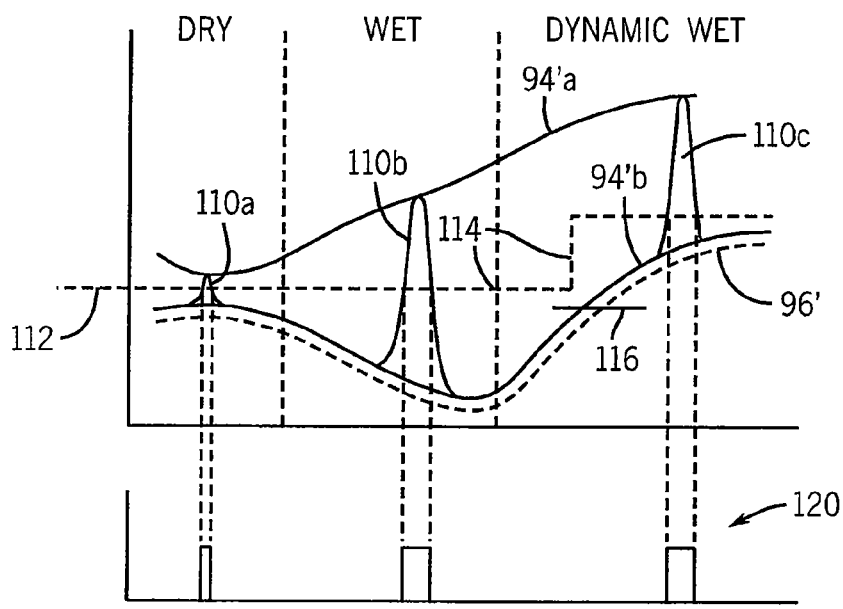
FIG. 6 is a set of two vertically aligned graphs, the first showing a change in signals from the sense electrode and reference electrode in different environmental conditions and in a touch and no-touch state positioned above a graph showing a switch signal.

Referring now to FIG. 6, the match signal 94' may have two states indicated by touch match signal 94'a when a finger is at the touch position and no-touch match signal 94'b when no finger is at the touch position. The strengths of these signals will vary depending on the environmental conditions around the touch switch 10, varying between dry, wet, and dynamic wet, the latter condition indicating blowing or streaming water. Generally the detection circuit 65 must establish a threshold between the touch match signal 94'a and no-touch match signal 94'b that may distinguish touches 110a, 110b, and 110c occurring in each of the different states of dry, wet, and dynamic wet. A single threshold 112 will generally be inadequate because of the substantial rise in the no-touch match signal 94'b under dynamic wet conditions. Accordingly the present invention tracks the signal 96' to produce a multistep threshold 114 being a function of signal 96' and rising as one moves into the dynamic wet state. In this case, for example, the threshold may be switched based on a rise of signal 96' above a predetermined threshold 116.

The signal 96' thus provides a running baseline against which to compare the match signal 94' that adapts to changes in the environment of the touch switch 10.

As indicated in FIG. 4, match signal 94' is compared to a threshold produced by threshold function 97 accepting as an argument signal 96'. The result of this comparison provided by summing block 118 provides a signal 120 which may be received by a time threshold block 124 filtering out very short touches 110a, for example, to provide additional immunity with respect to electrical noise.

Figure 7:
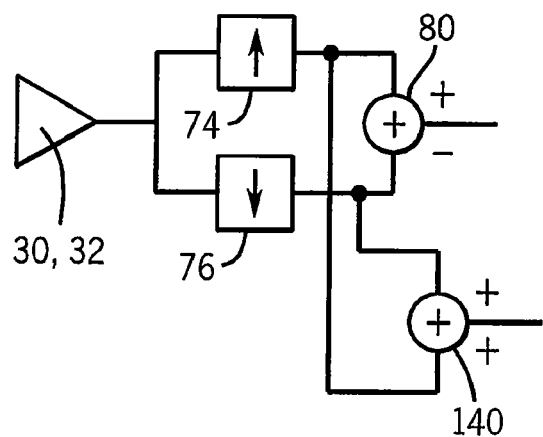
FIG. 7 is a fragmentary detail of the peak capture circuitry of FIG. 4 used for detection of electrode malfunction.

Referring now to FIGS. 5 and 7, environmental interference such as electrical interference 90 or surface contamination may produce asymmetry in spikes 58'a and 58'b as shown in FIG. 5. This asymmetry may be detected by means of a comparator 140 receiving the output of the peak grabber 74 and trough grabber 76 and adding the two together. When the spikes 58 are symmetric, this output of comparator 140 is zero indicating proper operation. When they are asymmetric this output has magnitude which can be used to trigger an error signal indicating a problem with the touch switch 10.

Figure 8:
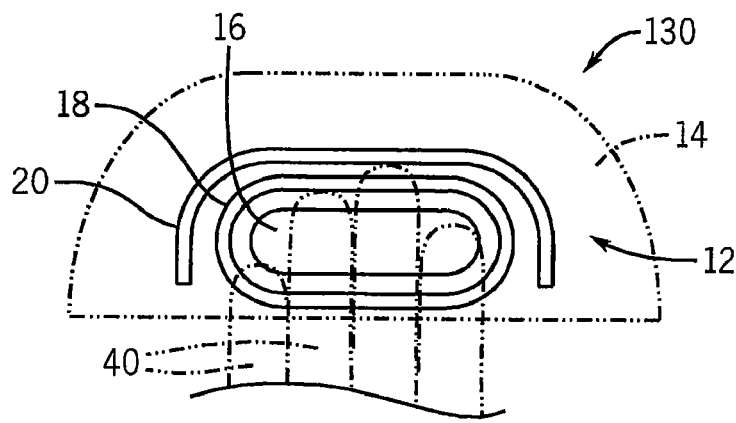
FIG. 8 is an elevational view of an alternative electrode arrangement for use in a switch position on a blind side of a latch.

Referring now to FIG. 8, the touch surface 14 may, for example, be positioned on the inside of a pocket 130 formed, for example, by a latch handle requiring the user's fingers 40 to cross over one side of the touch surface 14 in order to reach the touch area of the sense electrode 16. In this case reference electrode 20 may be broken and removed from the area over which the fingers 40 cross so as to preserve its quality as measuring environmental rather than touch changes.

Figure 9:
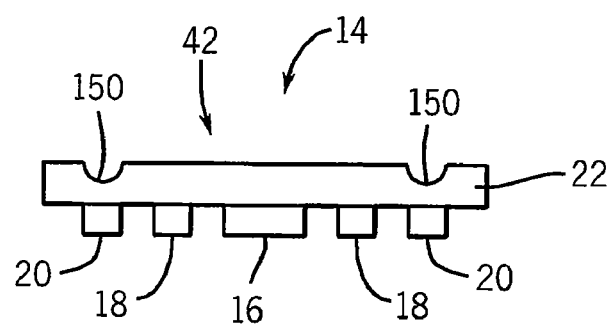
FIG. 9 is a figure similar to that of FIGS. 2 and 3 showing the addition of front surface grooves to promote proper finger placement.

Referring now to FIG. 9, a front side of the touch surface 14 may have the touch area 42 circumscribed by a tactile feature 150 such as a groove positioned over the reference electrode 20 to cause a user to place their fingers (not shown) toward the sense electrode 16 and away from the reference electrode 20. This feature 150 is particularly helpful when the touch surface 14 is positioned, for example, as described with respect to FIG. 8, in a manner so as to be out of sight.

It is specifically intended that the present invention not be limited to the embodiments and illustrations contained herein and the claims should be understood to include modified forms of those embodiments including portions of the embodiments and combinations of elements of different embodiments as come within the scope of the following claims.

We claim:

1. A capacitive touch switch comprising:
    an electrically insulating touch surface providing touch area for activation of the touch switch;
    a sense electrode positioned behind the touch surface at the touch area;
    an antenna electrode positioned behind the touch surface proximate to the sense electrode;
    a reference electrode positioned behind the touch surface proximate to the antenna electrode but removed from the touch area relative to the sense electrode;
    a detector circuit monitoring the capacitive coupling between the antenna electrode and each of the sense electrode and reference electrode to provide a switch output based on a comparison of the capacitive coupling between the antenna electrode and the sense electrode compared to a threshold that is a function of the capacitive coupling between the antenna electrode and the reference electrode;
    whereby effects of capacitive coupling to surface contamination on the touch surface may be minimized.

2. The capacitive touch switch of claim 1 wherein the antenna electrode forms a ring around the sense electrode and the reference electrode forms a ring around the antenna electrode.

3. The capacitive touch switch of claim 1 wherein the antenna electrode forms a ring around the sense electrode and the reference electrode surrounds the antenna electrode except in an access direction likely to be proximate to a user's hand during use of the capacitive touch switch.

4. The capacitive touch switch of claim 3 wherein the touch surface includes a tactile feature guiding a user's fingers away from the reference electrode and toward the sense electrode.

5. The capacitive touch switch of claim 4 wherein the tactile feature is a groove.

6. The capacitive touch switch of claim 1 wherein the capacitive coupling between the antenna electrode and the reference electrode is averaged over a time window greater than a time window of an average applied to the capacitive coupling between the antenna electrode and the sense electrode, whereby the reference electrode may better track slowly varying environmental contamination.

7. The capacitive touch switch of claim 1 wherein the sense electrode and reference electrode receive capacitively coupled signals and further include a peak detector system detecting a peak and trough of the signals to provide a difference between their heights, wherein sensitivity to capacitive coupling is increased.

8. The capacitive touch switch of claim 1 wherein the detector circuit includes:
    a modulator producing an irregular excitation signal communicated to the antenna electrode, wherein the irregular excitation signal consists of a series of pulses varying in at least one of magnitude and spacing; and
    a demodulator communicating with the sense electrode to receive the irregular excitation signal as capacitively coupled from the antenna electrode, the demodulator discriminating between the irregular excitation signal and other electrical signals to trigger the switch output.

9. The capacitive touch switch of claim 8 wherein the demodulator operates synchronously with the modulator.

10. The capacitive touch switch of claim 8 wherein the irregular excitation signals consist of a series of pulses varying in both of magnitude and spacing.

11. The capacitive touch switch of claim 8 wherein further including a timer element requiring detection of a demodulated signal by the demodulator for a predetermined time period before producing an output switch signal.

12. The capacitive touch switch of claim 8 wherein the pulses have a dominant frequency in substantially the range from 100 Hz to 10 kHz.

13. The capacitive touch switch of claim 1 further including a monitoring circuit monitoring asymmetry of a signal received from the sense electrode with respect to ground to detect switch failure.

14. The capacitive touch switch of claim 1 wherein the detector circuit is implemented at least in part by a microprocessor.

* * * * *